US012625187B2

(12) United States Patent
Kim et al.

(10) Patent No.:     US 12,625,187 B2
(45) Date of Patent:     *May 12, 2026

(54) METHOD AND APPARATUS WITH BATTERY STATE ESTIMATION

(71) Applicants: SAMSUNG ELECTRONICS CO., LTD., Suwon-si (KR); SAMSUNG SDI CO., LTD., Yongin-si (KR)

(72) Inventors: Jinho Kim, Yongin-si (KR); Tae Won Song, Yongin-si (KR)

(73) Assignees: SAMSUNG ELECTRONICS CO., LTD., Suwon-si (KR); Samsung SDI Co., Ltd., Yongin-si (KR)

( * ) Notice: Subject to any disclaimer, the term of this patent is extended or adjusted under 35 U.S.C. 154(b) by 69 days.

This patent is subject to a terminal disclaimer.

(21) Appl. No.: 18/631,429

(22) Filed:     Apr. 10, 2024

(65)                Prior Publication Data

US 2024/0255575 A1       Aug. 1, 2024

Related U.S. Application Data

(60) Continuation of application No. 17/683,483, filed on Mar. 1, 2022, now Pat. No. 11,982,714, which is a
(Continued)

(30)         Foreign Application Priority Data

Oct. 22, 2019     (KR) ........................ 10-2019-0131570

(51) Int. Cl.
G01R 31/367          (2019.01)
G01R 31/36           (2020.01)
(Continued)

(52) U.S. Cl.
CPC ....... G01R 31/367 (2019.01); G01R 31/3648 (2013.01); G01R 31/3842 (2019.01); G01R 31/392 (2019.01); *G01R 31/387* (2019.01)

(58) Field of Classification Search
CPC .............. G01R 31/367; G01R 31/3648; G01R 31/3842; G01R 31/392; G01R 31/387
See application file for complete search history.

(56)                References Cited

U.S. PATENT DOCUMENTS

| | | | |
|---|---|---|---|
| 6,534,954 B1 | 3/2003 | Plett | |
| 7,879,485 B2 | 2/2011 | Yoon et al. | |

(Continued)

FOREIGN PATENT DOCUMENTS

| | | |
|---|---|---|
| CN | 104049215 A | 9/2014 |
| CN | 105699907 A | 6/2016 |

(Continued)

OTHER PUBLICATIONS

Chinese Office Action Issued on Mar. 1, 2025, in Counterpart Chinese Patent Application No. 202010161222.7 (16 Pages in English, 11 Pages in Chinese).
(Continued)

*Primary Examiner* — John C Kuan
(74) *Attorney, Agent, or Firm* — Sughrue Mion, PLLC

(57)                ABSTRACT

A processor-implemented method with battery state estimation includes: determining a state variation of a battery using a voltage difference between a sensed voltage of the battery and an estimated voltage of the battery that is estimated by an electrochemical model corresponding to the battery; updating an internal state of the electrochemical model based on the determined state variation of the battery; and estimating state information of the battery based on the updated internal state of the electrochemical model.

5 Claims, 18 Drawing Sheets

Related U.S. Application Data division of application No. 16/814,212, filed on Mar. 10, 2020, now Pat. No. 11,293,988.

(51) Int. Cl.

| | |
|---|---|
| *G01R 31/3842* | (2019.01) |
| *G01R 31/387* | (2019.01) |
| *G01R 31/392* | (2019.01) |

(56) References Cited

U.S. PATENT DOCUMENTS

| | | |
|---|---|---|
| 8,117,857 B2 | 2/2012 | Kelty et al. |
| 8,508,191 B2 | 8/2013 | Kim et al. |
| 8,618,775 B2 | 12/2013 | Hermann et al. |
| 8,624,560 B2 | 1/2014 | Ungar et al. |
| 8,961,203 B2 | 2/2015 | Lee |
| 8,972,213 B2 | 3/2015 | Zhang et al. |
| 2009/0276172 A1 | 11/2009 | Nishi |
| 2010/0033132 A1 | 2/2010 | Nishi et al. |
| 2011/0031938 A1 | 2/2011 | Ishikawa |
| 2011/0161025 A1 | 6/2011 | Tomura et al. |
| 2012/0316812 A1 | 12/2012 | Umeki et al. |
| 2015/0355283 A1 | 12/2015 | Lee |
| 2016/0018469 A1 | 1/2016 | Ho |
| 2016/0054390 A1 | 2/2016 | Lin et al. |
| 2016/0093927 A1 | 3/2016 | Marcicki et al. |
| 2017/0045587 A1 | 2/2017 | Kim et al. |
| 2017/0125853 A1 | 5/2017 | Song et al. |
| 2017/0168119 A1 | 6/2017 | Tagade et al. |
| 2018/0045788 A1 | 2/2018 | Kawai et al. |
| 2018/0100898 A1 | 4/2018 | Benosman et al. |
| 2018/0143254 A1 | 5/2018 | Kim et al. |
| 2019/0190091 A1 | 6/2019 | Kim et al. |
| 2021/0013731 A1 | 1/2021 | Choe et al. |
| 2022/0221516 A1* | 7/2022 | Lee ...................... G01R 31/367 |

FOREIGN PATENT DOCUMENTS

| | | |
|---|---|---|
| JP | 3196071 B2 | 8/2001 |
| JP | 2005-227164 A | 8/2005 |
| JP | 3714330 B2 | 11/2005 |
| JP | 2013-238402 A | 11/2013 |
| KR | 10-0669475 B1 | 1/2007 |
| KR | 10-0804698 B1 | 2/2008 |
| KR | 10-0884530 B1 | 2/2009 |
| KR | 10-1191624 B1 | 10/2012 |
| KR | 10-2018-0057202 A | 5/2018 |
| KR | 10-2019-0073236 A | 6/2019 |

OTHER PUBLICATIONS

Han, Xuebing, et al. "A comparative study of commercial lithium ion battery cycle life in electrical vehicle: Aging mechanism identification." *Journal of Power Sources* 251, 2014 (pp. 38-54).

Extended European Search Report issued on Oct. 27, 2020 in counterpart European Patent Application No. 20176274.7 (9 pages in English).

* cited by examiner

1300

1600

1610

Battery pack

METHOD AND APPARATUS WITH BATTERY STATE ESTIMATION

CROSS-REFERENCE TO RELATED APPLICATIONS

This application is a continuation of application Ser. No. 17/683,483 filed on Mar. 1, 2022, which is a division of application Ser. No. 16/814,212 filed on Mar. 10, 2020, which claims the benefit under 35 USC § 119(a) of Korean Patent Application No. 10-2019-0131570 filed on Oct. 22, 2019, in the Korean Intellectual Property Office, the entire disclosure of which is incorporated herein by reference for all purposes.

BACKGROUND

1. Field

The following description relates to a method and apparatus with battery state estimation.

2. Description of Related Art

There are various methods to estimate a state of a battery. For example, such methods may include estimating a state of a battery by integrating an electrical current of a battery or using a battery model, for example, an electric circuit model or an electrochemical model.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method with battery state estimation includes: determining a state variation of a battery using a voltage difference between a sensed voltage of the battery and an estimated voltage of the battery that is estimated by an electrochemical model corresponding to the battery; updating an internal state of the electrochemical model based on the determined state variation of the battery; and estimating state information of the battery based on the updated internal state of the electrochemical model.

The determining of the state variation of the battery may include determining the state variation of the battery based on the voltage difference, previous state information previously estimated by the electrochemical model, and an open-circuit voltage (OCV) table.

The determining of the state variation of the battery may further include obtaining an OCV corresponding to the previous state information based on the OCV table, and applying the voltage difference to the obtained OCV.

The updating of the internal state of the electrochemical model may include correcting an ion concentration distribution in an active material particle or an ion concentration distribution in an electrode based on the determined state variation of the battery.

The updating of the internal state of the electrochemical model may include uniformly correcting an ion concentration distribution in an active material particle or an ion concentration distribution in an electrode based on the determined state variation of the battery.

The updating of the internal state of the electrochemical model may include determining a concentration gradient characteristic based on a diffusion characteristic based on the determined state variation of the battery, and correcting an ion concentration distribution of the battery based on the determined concentration gradient characteristic.

The updating of the internal state of the electrochemical model may further include calculating a diffusion equation of an active material based on the determined state variation of the battery, and correcting an ion concentration distribution in an active material particle or an ion concentration distribution in the electrode.

The internal state of the electrochemical model may include any one or any combination of any two or more of a positive electrode lithium-ion concentration distribution of the battery, a negative electrode lithium-ion concentration distribution of the battery, and an electrolyte lithium-ion concentration distribution of the battery.

The method may further include: verifying whether the voltage difference between the sensed voltage of the battery and the estimated voltage of the battery exceeds a threshold voltage difference.

The electrochemical model may be configured to estimate state information of a target battery among a plurality of batteries. The sensed voltage may be a voltage measured from the target battery. The estimated voltage may be a voltage previously estimated from another battery among the plurality of batteries by the electrochemical model.

The battery may be a battery cell, a battery module, or a battery pack.

The estimated state information of the battery may include any one or any combination of any two or more of a state of charge (SOC), a state of heath (SOH), and abnormality state information.

In another general aspect, a non-transitory computer-readable storage medium stores instructions that, when executed by a processor, cause the processor to perform the method described above.

In another general aspect, a processor-implemented method with battery state estimation includes: obtaining sensing data including a sensed voltage of a battery; obtaining an estimated voltage of the battery from the sensing data using an electrochemical model corresponding to the battery; calculating a first voltage difference between the sensed voltage of the battery and the estimated voltage of the battery; selecting a correction method of the electrochemical model based on the first voltage difference; correcting an internal state of the electrochemical model or a sensed current to be input to the electrochemical model by applying the selected correction method to the electrochemical model; and estimating state information of the battery using the electrochemical model to which the correction method is applied.

The correcting of the internal state of the electrochemical model or the sensed current to be input to the electrochemical model based on the selected correction method may include: updating the internal state of the electrochemical model using a state variation of the battery determined by the first voltage difference between a voltage of the battery sensed in a current time period and a voltage of the battery estimated by the electrochemical model; or correcting a sensed current of the battery in the current time period to be input to the electrochemical model using a capacity error corresponding to a second voltage difference between a sensed voltage of the battery in a previous time period and an estimated voltage of the battery in the previous time period.

3

The selecting of the correction method of the electrochemical model based on the first voltage difference may include: in response to the first voltage difference being greater than a threshold voltage difference, selecting a correction method of correcting the internal state of the electrochemical model; and in response to the first voltage difference being less than or equal to the threshold voltage difference, selecting a correction method of correcting the sensed current to be input to the electrochemical model.

The selecting of the correction method of the electrochemical model may include selecting the correction method of the electrochemical model such that a correction method of correcting the sensed current to be input to the electrochemical model is to be performed more frequently than a correction method of correcting the internal state of the electrochemical model.

In another general aspect, a non-transitory computer-readable storage medium may store instructions that, when executed by a processor, cause the processor to perform the method described above.

In another general aspect, an apparatus with battery state estimation includes: a processor configured to determine a state variation of a battery using a voltage difference between a sensed voltage of the battery and an estimated voltage of the battery that is estimated by a stored electrochemical model corresponding to the battery, update an internal state of the electrochemical model based on the determined state variation, and estimate state information of the battery based on the updated internal state of the electrochemical model.

The processor may be further configured to determine the state variation of the battery based on the voltage difference, previous state information that is previously estimated by the electrochemical model, and an open-circuit voltage (OCV) table.

The processor may be further configured to determine the state variation of the battery by obtaining an OCV corresponding to the previous state information based on the OCV table and applying the voltage difference to the obtained OCV.

The processor may be further configured to update the internal state of the electrochemical model by correcting an ion concentration distribution in an active material particle or an ion concentration distribution in an electrode based on the determined state variation of the battery.

The processor may be further configured to update the internal state of the electrochemical model by uniformly correcting an ion concentration distribution in an active material particle or an ion concentration distribution in an electrode based on the determined state variation of the battery.

The processor may be further configured to: update the internal state of the electrochemical model by determining a concentration gradient characteristic based on a diffusion characteristic based on the determined state variation of the battery, and by correcting an ion concentration distribution in an active material particle or an ion concentration distribution in an electrode based on the determined concentration gradient characteristic.

The electrochemical model may be configured to estimate state information of a target battery among a plurality of batteries. The sensed voltage may be a voltage measured from the target battery. The estimated voltage may be a voltage previously estimated from another battery among the plurality of batteries by the electrochemical model.

The apparatus may further include a memory storing the electrochemical model.

4

The estimated state information of the battery may include any one or any combination of any two or more of a state of charge (SOC), a state of heath (SOH), and abnormality state information.

The apparatus may be a vehicle or a mobile device, and may be powered by the battery.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
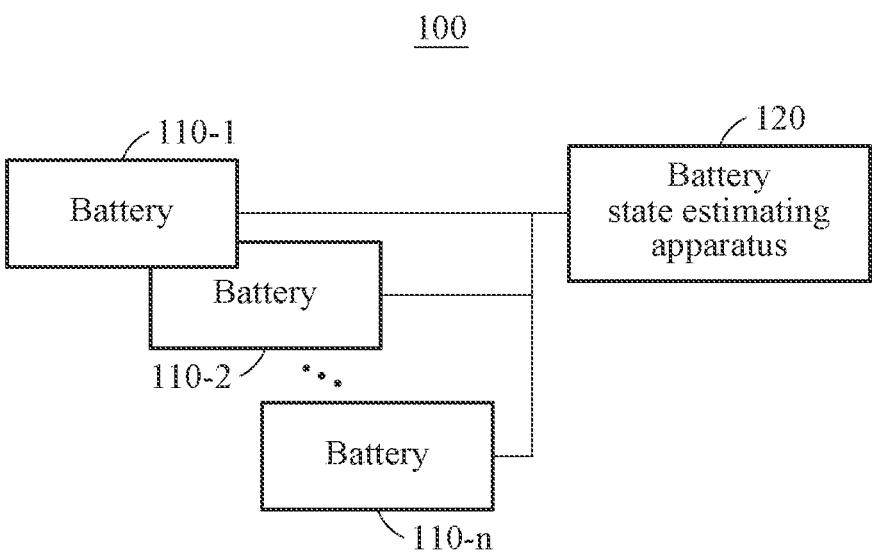
FIGS. 1 and 2 illustrate an example of a battery system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of this application. Terms, such as those defined in commonly used dictionaries, are to be interpreted as having a meaning that is consistent with their meaning in the context of the relevant art and the disclosure of this application and are not to be interpreted in an idealized or overly formal sense unless expressly so defined herein.

Also, in the description of example embodiments, detailed description of structures or functions that are thereby known after an understanding of the disclosure of this application will be omitted when it is deemed that such description will cause ambiguous interpretation of the example embodiments.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
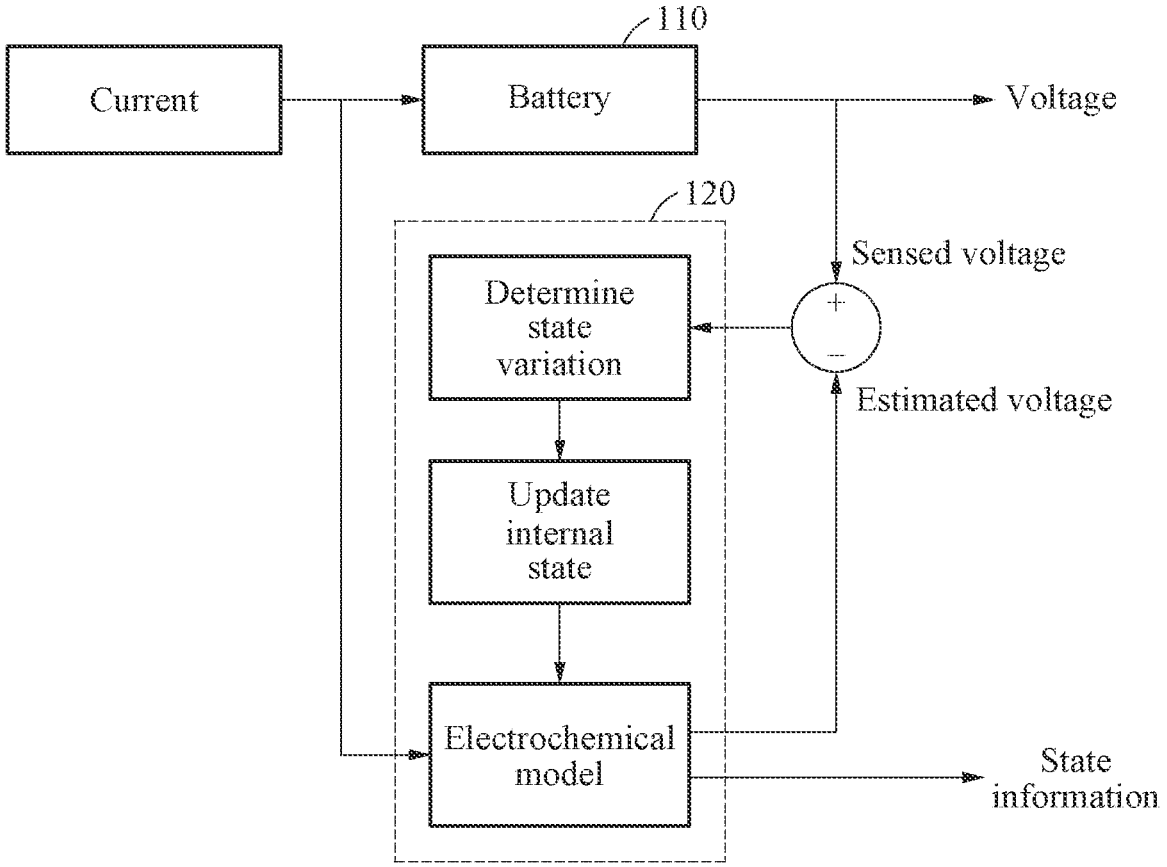

FIGS. 1 and 2 illustrate an example of a battery system.

Referring to FIG. 1, a battery system 100 includes, for example, a plurality of batteries 110-1 through 110-$n$ and an apparatus 120 with battery state estimation. The apparatus 120 with battery state estimation will be hereinafter simply referred to as a battery state estimating apparatus 120.

Each of the batteries 110-1 through 110-$n$ may be a battery cell, a battery module, or a battery pack.

The battery state estimating apparatus 120 may sense each of the batteries 110-1 through 110-$n$ using at least one sensor. That is, the battery state estimating apparatus 120 may collect sensing data of each of the batteries 110-1 through 110-$n$. The sensing data may include, for example, voltage data, current data, and/or temperature data.

The battery state estimating apparatus 120 may estimate state information of each of the batteries 110-1 through 110-$n$ and output a result of the estimating. The state information may include, for example, a state of charge (SOC), a state of heath (SOH), and/or abnormality state information. A battery model used to estimate such state information may be, for example, an electrochemical model which will be described hereinafter with reference to FIG. 2.

FIG. 2 illustrates an example of estimating the state information using the battery model.

Referring to FIG. 2, the battery state estimating apparatus 120 may estimate state information of a battery 110 using an electrochemical model corresponding to the battery 110. The battery 110 may for example, correspond to any one of the batteries 110-1 through 110-$n$ described above with respect to FIG. 1. The electrochemical model may be configured to model an internal physical phenomenon, such as, for example, a potential of a battery and an ion concentration distribution, and estimate state information of the battery.

A level of accuracy in estimating the state information of the battery 110 may affect an optimal operation and control of the battery 110. When estimating the state information using the electrochemical model, there may be an error between sensor information that is obtained by a sensor configured to measure current, voltage, and temperature data and is to be input to the electrochemical model, and state information calculated through a modeling method. The error may need to be compensated for or corrected. The terms "compensated for" and "corrected" may be interchangeably used herein.

In an example, the battery state estimating apparatus 120 may determine a voltage difference between a sensed voltage of the battery 110 that is measured by a sensor and an estimated voltage of the battery 110 that is estimated by the electrochemical model. The battery state estimating apparatus 120 may then determine a state variation of the battery 110 using the determined voltage difference. The battery state estimating apparatus 120 may then update an internal state (e.g., a potential of the battery and/or an ion concentration distribution) of the electrochemical model based on the determined state variation. The battery state estimating apparatus 120 may then estimate state information of the battery 110 based on the updated internal state of the electrochemical model. As described, the battery state estimating apparatus 120 may determine a state variation of a battery such that a voltage difference between a sensed voltage of the battery and an estimated voltage of the battery is to be minimized, and update an internal state of the electrochemical model. Through such a feedback structure, the battery state estimating apparatus 120 may estimate accurate state information of the battery 110 without increasing a model complexity and an operation or calculation amount.

Figure 3:
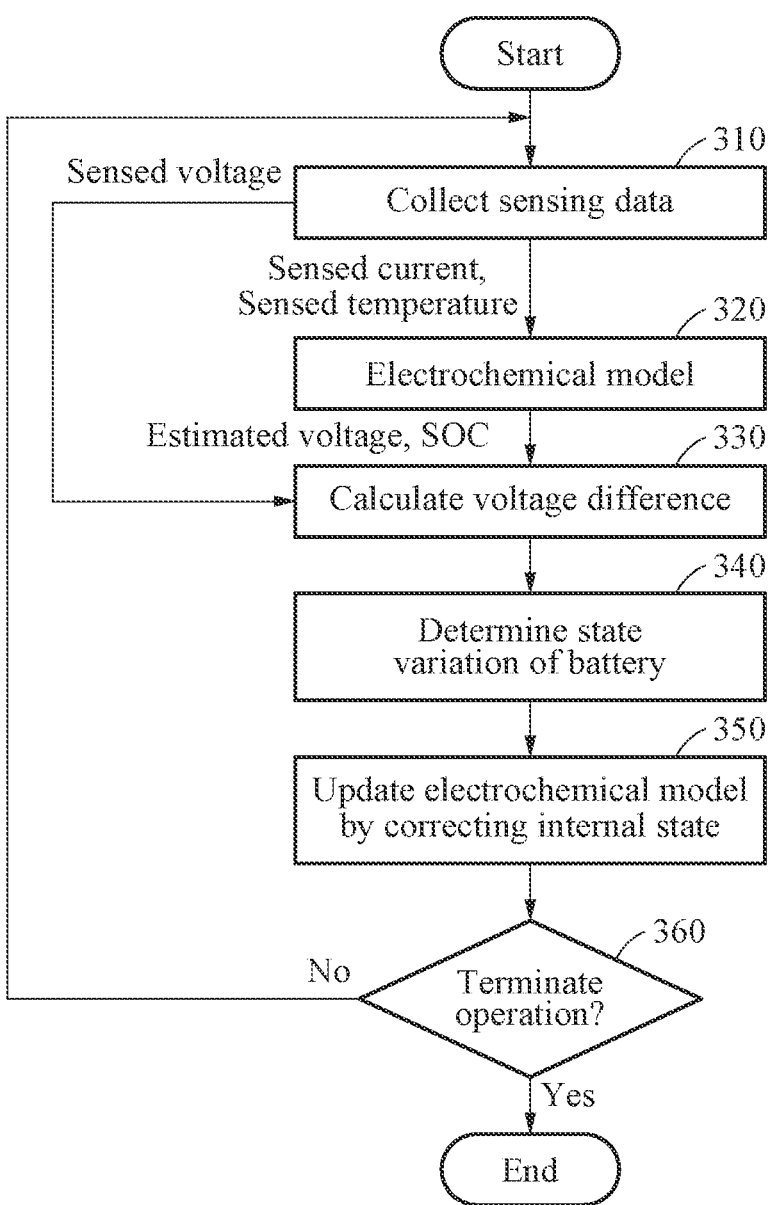
FIG. 3 illustrates an example of estimating a state of a battery.

FIG. 3 is a flowchart illustrating an example of determining state information of a battery by a battery state estimating apparatus. In an example, a state of a battery may be estimated in a plurality of time periods and the battery state estimating apparatus may estimate state information of the battery in each of the time periods. Such example will be described as applied to a single cell model for the convenience of description.

Referring to FIG. 3, in operation 310, the battery state estimating apparatus collects sensing data of a battery. The sensing data may include, for example, a sensed voltage, a sensed current, and a sensed temperature. For example, the sensing data may be stored in a form of a profile indicating a change in magnitude over time.

In operation 320, an estimated voltage of the battery and state information (e.g., SOC) of the battery are determined, for example, by an electrochemical model to which the sensed current and the sensed temperature are input.

In operation 330, the battery state estimating apparatus calculates a voltage difference between the sensed voltage of the battery and the estimated voltage that is estimated by the electrochemical model. For example, the voltage difference may be determined to be a moving average voltage for a latest preset time period.

Although not illustrated in FIG. 3, according to an example, the battery state estimating apparatus may determine whether the state information of the battery needs to be corrected, based on whether the calculated voltage difference exceeds a threshold voltage difference. When an error occurs in the electrochemical model, the estimated voltage that is obtained using the electrochemical model may differ from the sensed voltage of the battery by a significant amount or an amount that results in the estimated voltage being excessively inaccurate. Thus, to prevent errors from being accumulated, the battery state estimating apparatus may determine whether the correcting is needed based on the voltage difference.

For example, when the calculated voltage difference exceeds the threshold voltage difference, the battery state estimating apparatus may determine that the state information of the battery needs to be corrected, and perform operation 340. In contrast, when the calculated voltage difference does not exceed the threshold voltage difference, the battery state estimating apparatus may determine that the state information of the battery does not need to be corrected, and return to operation 310 without performing operations 340, 350, and 360.

In operation 340, the battery state estimating apparatus determines a state variation of the battery using the calculated voltage difference. For example, the battery state estimating apparatus may determine the state variation of the battery based on the calculated voltage difference, previous state information of the battery, and an open-circuit voltage (OCV) table. The previous state information of the battery may be the state information that is previously estimated using the electrochemical model in operation 320. For example, the state variation may include an amount of change in SOC, hereinafter simply an SOC variation, which will be described in greater detail with reference to FIGS. 7 and 8.

In operation 350, the battery state estimating apparatus updates the electrochemical model by correcting an internal state of the electrochemical model based on the state variation of the battery. For example, the battery state estimating apparatus may update the internal state of the electrochemical model by correcting an ion concentration distribution in an active material particle or an ion concentration distribution in an electrode, based on the state variation of the battery. In such an example, an active material may include a positive electrode and a negative electrode of the battery. The battery state estimating apparatus estimates the state information of the battery using the electrochemical model of which the internal state is updated. Thus, through such a feedback structure by which the battery state estimating apparatus determines the state variation of the battery to minimize the voltage difference between the sensed voltage of the battery and the estimated voltage of the battery that is estimated by the electrochemical model, and then updates the internal state of the electrochemical model, it is possible to estimate the state information of the battery more accurately with fewer operations and/or calculations. A more detailed description of an example of updating the electrochemical model will follow hereinafter with reference to FIGS. 9 through 11.

In operation 360, the battery state estimating apparatus determines whether to terminate an operation of estimating of a state of the battery. For example, when a preset operation period has not elapsed, the battery state estimating apparatus returns to operation 310 for a next period. In contrast, when the operation period has elapsed, the battery state estimating apparatus terminates the operation of estimating a state of the battery.

In an example embodiment, a battery state estimating apparatus may determine state information of a plurality of batteries in each of a plurality of time periods. The battery state estimating apparatus may select a target battery, among the plurality of batteries, from which state information is to be estimated in each of the time periods using an electrochemical model. That is, in each of the time periods, the battery state estimating apparatus may determine state information of a target battery using the electrochemical model, and determine state information of remaining batteries using a current integration method. The current integration method may be a method of estimating a remaining amount of a battery, or a SOC, by integrating a current amount to be charged or discharged through a current sensor disposed at an end of the battery.

In a next time period, the target battery from which the state information is estimated based on the electrochemical model may switch to another battery. For example, a target battery set in a first time period among a plurality of time periods may be set to be a nontarget battery in a second time period, and a nontarget battery in the first time period may be set to be a target battery in the second time period.

As described above, by sequentially setting a target battery in a preset order and estimating state information of a battery using the electrochemical model, it is possible to effectively and rapidly estimate a state of the battery with a relatively greater level of accuracy, without a burden of an amount of operations or calculations, even though using the electrochemical model that requires a relatively greater amount of operations or calculations. This will be referred to as a cell switch model for the convenience of description. An example of the cell switch model will be described in greater detail below, with reference to FIGS. 4 and 5.

Figure 4:
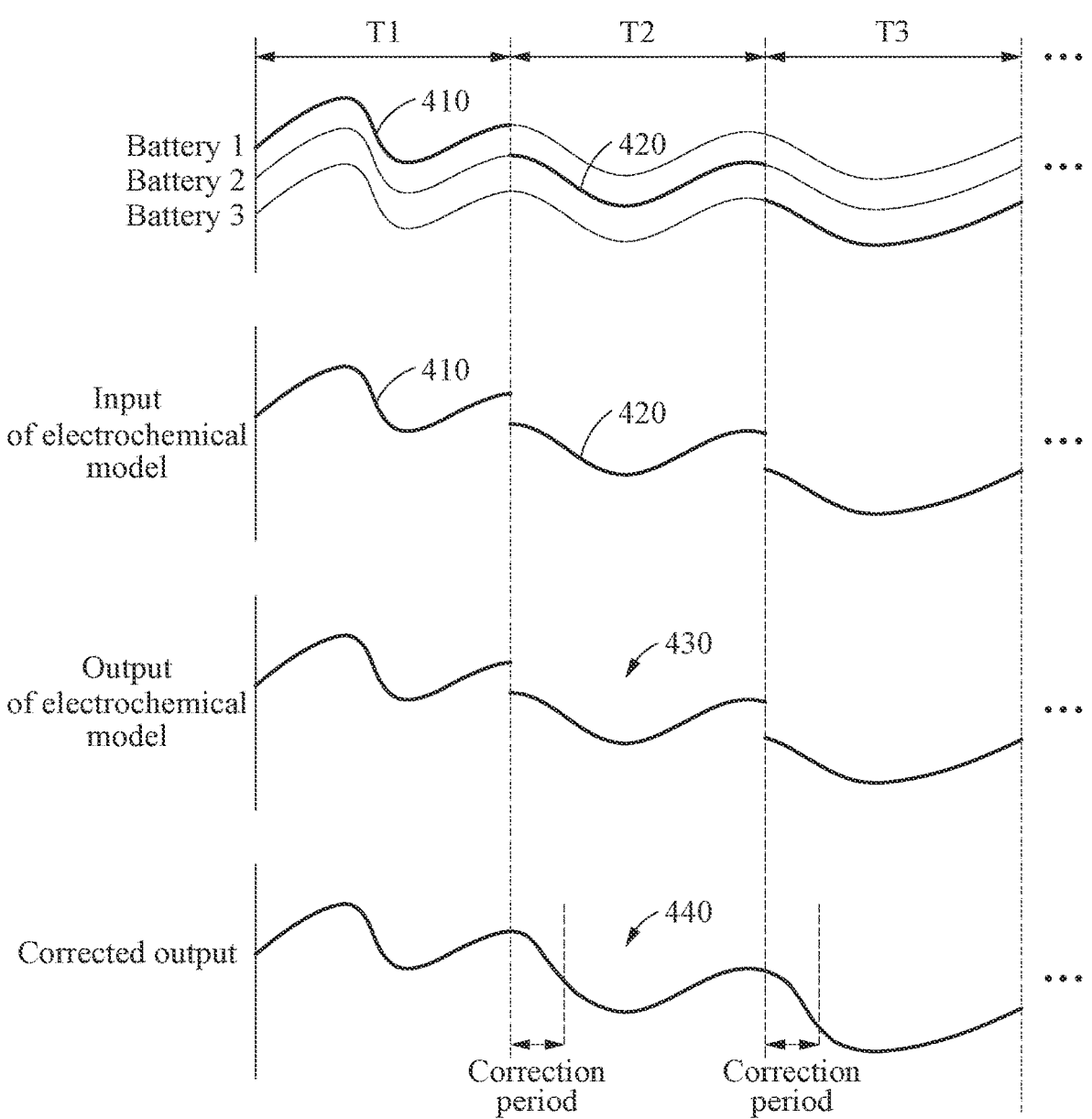
FIGS. 4 and 5 illustrate an example of estimating a state of a battery.

FIG. 4 illustrates an example of a process by which a battery state estimating apparatus determines state information of a target battery in each of a plurality of time periods.

Referring to FIG. 4, a battery 1 is set to be a target battery in time period T1, and a sensed voltage 410 of the battery 1 is input to an electrochemical model, and then state information of the battery 1 is estimated by the electrochemical model. When a time period changes from time period T1 to time period T2, the target battery switches from the battery 1 to the battery 2, and the electrochemical model receives a sensed voltage 420 of the battery 2 instead of the sensed voltage 410 of the battery 1. That is, at a switching time, there may be a discontinuity between the sensed voltage 410 and the sensed voltage 420 to be input to the electrochemical model. In the presence of such discontinuity, when the electrochemical model derives and outputs state information of the battery 2 from the sensed voltage 420, the output of the electrochemical model may have a discontinuity on a boundary between time period T1 and time period T2 as illustrated in a graph 430. This discontinuity may be corrected because it may be applied as an initial error of the electrochemical model when estimating the state information of the battery 2. The output of the electrochemical model that is corrected through correction to be described hereinafter may exhibit a continuity as illustrated in a graph 440.

Figure 5:
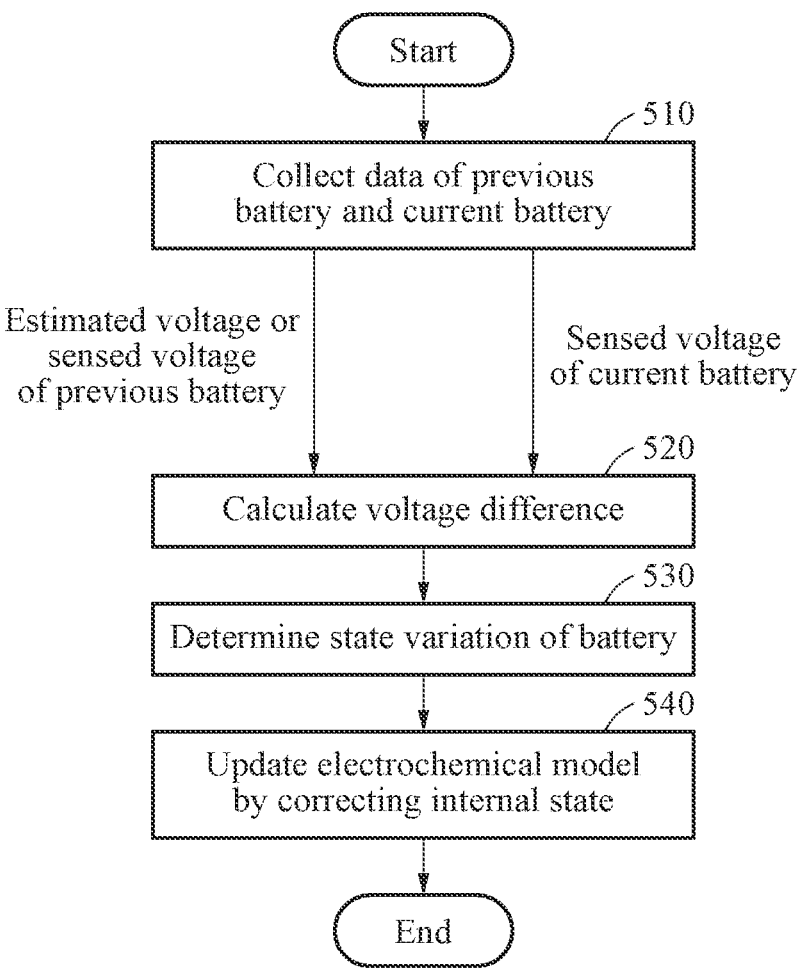

FIG. 5 is a flowchart illustrating an example of a process by which a battery state estimating apparatus determines state information of a target battery using an electrochemical model when the target battery switches to another target battery. However, during a time in which the target battery does not switch to another battery in a cell switch model, a method of estimating a state of a battery described above with reference to FIG. 3 may be applied.

Referring to FIG. 5, in operation 510, the battery state estimating apparatus collects data of a previous battery and a current battery. The current battery may be a battery that is selected as a target battery in a current time period, and the previous battery may refer to a battery that was selected as a target battery in a previous time period. For example, the battery state estimating apparatus may collect sensing data of the current battery, and collect sensing data and/or an estimated voltage of the previous battery. The sensing data may include, for example, a sensed voltage, a sensed current, and a sensed temperature, and may be stored in a form of a profile indicating a change in magnitude over time. The estimated voltage of the previous battery may be a voltage of the previous battery that is estimated by an electrochemical model in the previous time period.

In operation 520, the battery state estimating apparatus calculates a voltage difference between the sensed voltage of the current battery (or the target battery) and the sensed voltage or the estimated voltage of the previous battery. For example, the voltage difference may be determined to be a moving average voltage for a latest preset time period.

Although not illustrated in FIG. 5, the battery state estimating apparatus determines whether state information of a battery needs to be corrected based on whether a calculated voltage difference exceeds a threshold voltage difference. Although a target battery does not switch, an estimated voltage may differ from a sensed voltage of the target battery due to an error occurring in the electrochemical model. Thus, whether such correction is needed or not may be determined based on the calculated voltage difference to prevent errors from being accumulated.

For example, when the calculated voltage difference exceeds the threshold voltage difference, the battery state estimating apparatus may determine that the state information of the battery needs to be corrected, and may perform operation 530. In contrast, when the calculated voltage difference does not exceed the threshold voltage difference, the battery state estimating apparatus may determine that the state information of the battery does not need to be corrected, and may estimate state information of the target battery using the electrochemical model without performing operations 530 and 540.

In operation 530, the battery state estimating apparatus determines a state variation of the current battery (or the target battery) using the calculated voltage difference. For example, the battery state estimating apparatus may determine the state variation of the current battery based on the calculated voltage difference, previous state information that is estimated in the previous time period, and an OCV table. The previous state information may be state information estimated by the electrochemical model from the previous battery that was selected as the target battery in the previous time period. The previous battery selected as the target battery in the previous time period may be a nontarget battery in the current time period. The state variation of the current battery may include an SOC variation, which will be described in greater detail hereinafter with reference to FIGS. 7 and 8.

In operation 540, the battery state estimating apparatus updates the electrochemical model by correcting an internal state of the electrochemical model based on the state variation of the current battery. For example, the battery state estimating apparatus may update the internal state of the electrochemical model by correcting an ion concentration distribution in an active material particle or an ion concentration distribution in an electrode based on the state variation of the current battery. The updating will be described in detail hereinafter with reference to FIGS. 9 through 11.

The battery state estimating apparatus may estimate state information of the current battery using the electrochemical model of which the internal state is updated. In addition, the battery state estimating apparatus may estimate, based on the electrochemical model, a voltage of the current battery or the target battery, or other properties such as, but not limited to, properties related to or indicative of a voltage of the current battery or the target battery.

Figure 6:
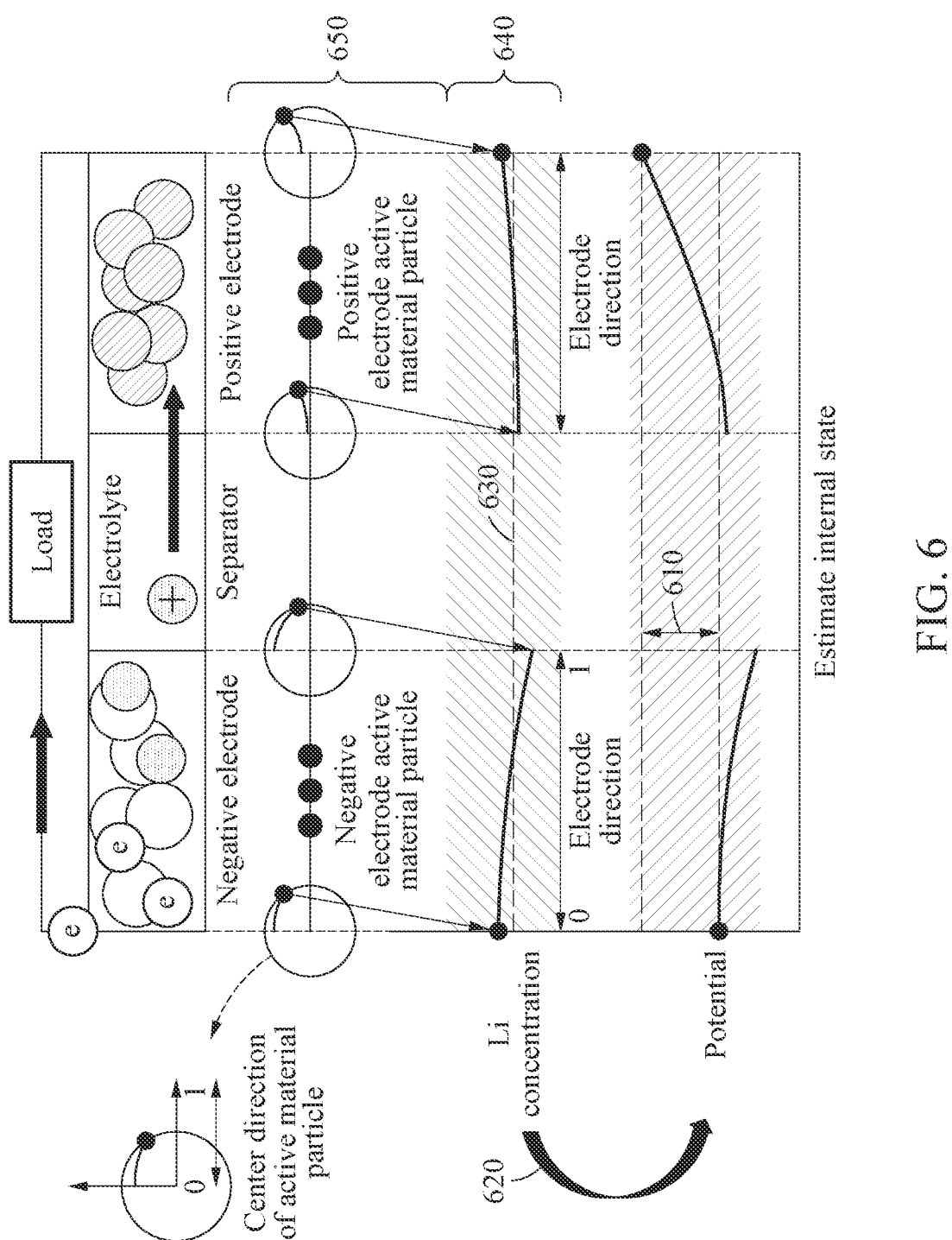
FIG. 6 illustrates an example of a battery model.

FIG. 6 illustrates an example of an electrochemical model.

Referring to FIG. 6, an electrochemical model may estimate a remaining amount, or an SOC, of a battery by modeling an internal physical phenomenon of the battery, for example, an ion concentration, a potential, and the like of the battery. That is, the electrochemical model may be represented by a physical conservation equation associated with an electrochemical reaction occurring on an electrode/ electrolyte interface, an ion concentration of an electrode and an electrolyte, and conservation of electrical charges. For the physical conservation equation, the electrochemical model may use various model parameters, for example, a shape (e.g., thickness, radius, etc.), an open-circuit potential (OCP), and a physical property value (e.g., electrical conductance, ionic conductance, diffusion coefficient, etc.).

In the electrochemical model, various state variables such as, for example, a concentration and a potential, may be coupled to one another. An estimated voltage 610 that is estimated by the electrochemical model may indicate a potential difference between both ends, which are a positive electrode and a negative electrode. As illustrated by reference numeral 620, potential information of each of the positive electrode and the negative electrode may be affected by an ion concentration distribution of each of the positive electrode and the negative electrode. An SOC 630 to be estimated by the electrochemical model may indicate an average ion concentration of the positive electrode and the negative electrode.

The ion concentration distribution described above may be an ion concentration distribution 640 in an electrode or an ion concentration distribution 650 in an active material particle present at a certain position in the electrode. The ion concentration distribution 640 in the electrode may be a surface ion concentration distribution or an average ion concentration distribution of an active material particle positioned in an electrode direction. The electrode direction may be a direction connecting one end of the electrode, for example, a boundary adjacent to a current collector, and another end of the electrode, for example, a boundary adjacent to a separator. In addition, the ion concentration distribution 650 in the active material particle may be an ion concentration distribution inside the active material particle based on a center direction of the active material particle. The center direction of the active material particle may be a direction connecting a center of the active material particle and a surface of the active material particle.

As described above, to reduce a voltage difference between a sensed voltage of a battery and an estimated voltage of the battery, a battery state estimating apparatus may move or change an ion concentration distribution of each of a positive electrode and a negative electrode while maintaining physical conservation associated with a concentration, obtain potential information of each of the positive electrode and the negative electrode based on the moved ion concentration distribution, and calculate a voltage based on the obtained potential information. The battery state estimating apparatus may calculate an internal state variation at which the voltage difference is to be 0 and finally determine an SOC of the battery.

Figure 7:
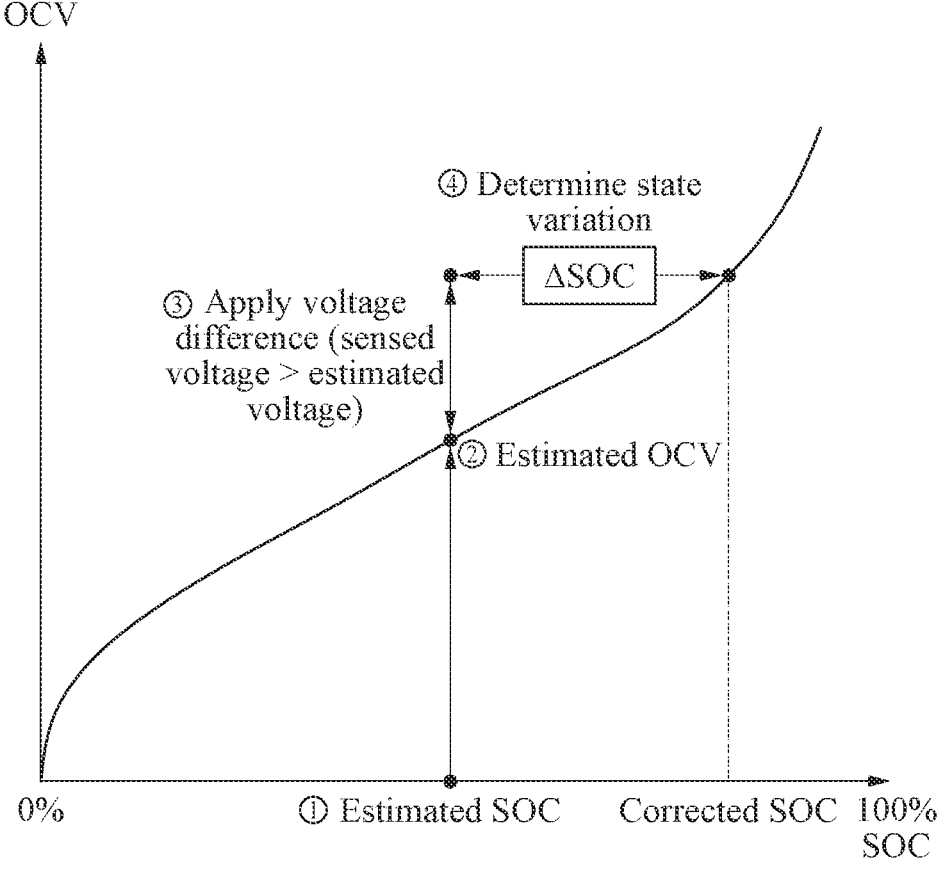
FIGS. 7 and 8 illustrate examples of determining a state variation of a battery.
Figure 8:
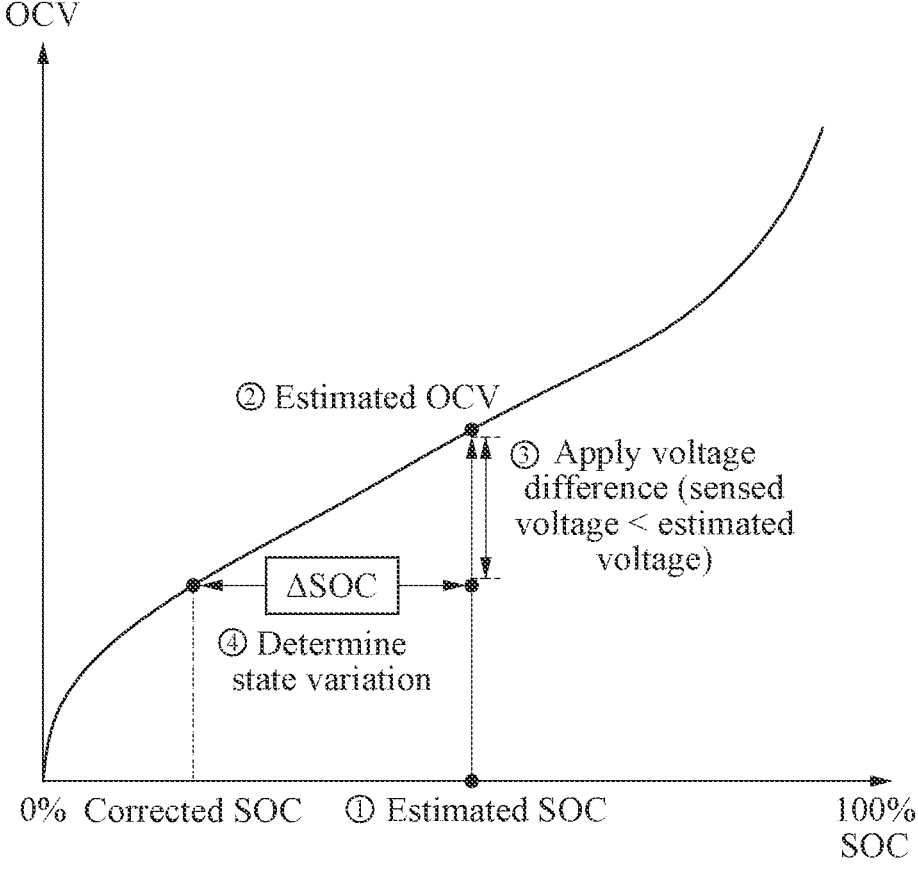

FIGS. 7 and 8 illustrate examples of determining a state variation of a battery.

FIG. 7 illustrates an example of determining a state variation of a battery in a case in which a sensed voltage of the battery is greater than an estimated voltage of the battery that is estimated by an electrochemical model. The estimated voltage may be a voltage of the battery that is estimated in a previous time period in a case of a single cell model described above with reference to FIG. 3. Alternatively, the estimated voltage may be an estimated voltage of a previous battery selected as a target battery in a previous time period in a case of a cell switch model described above with reference to FIGS. 4 through 6.

In an example, an OCV table indicates an SOC-OCV curve indicating an intrinsic characteristic of a battery. When using the OCV table, ΔSOC to be corrected may vary according to an SOC value, and SOC information of a previous time period that is lastly (e.g., most recently) estimated may be used. In a case of the single cell model described above with reference to FIG. 3, the SOC information of the previous time period may be an estimated SOC of the battery in the previous time period. In a case of the cell switch model described above with reference to FIGS. 4 through 6, the SOC information of the previous time period may be an estimated SOC of a previous battery selected as a target battery in the previous time period.

An estimated OCV, which is an OCV corresponding to the SOC information of the previous time period, may be obtained through the characteristic curve of the OCV table illustrated in FIG. 7. A previously calculated voltage difference may be applied to the estimated OCV. This example pertains to a case in which a sensed voltage is greater than an estimated voltage, and thus the calculated voltage difference may be applied by adding the calculated voltage difference to the estimated OCV. Using the characteristic curve of the OCV table, a corrected SOC corresponding to a result of applying the calculated voltage difference may be determined, and a difference between the estimated SOC and the corrected SOC may be determined to be ΔSOC which indicates a state variation.

FIG. 8 illustrates an example of determining a state variation of a battery in a case in which a sensed voltage of the battery is less than an estimated voltage of the battery that is estimated by an electrochemical model. The estimated voltage may be a voltage of the battery that is estimated in a previous time period in a case of a single cell model described above with reference to FIG. 3. Alternatively, the estimated voltage may be an estimated voltage of a previous battery selected as a target battery in a previous time period in a case of a cell switch model described above with reference to FIGS. 4 through 6.

As described above, when using an OCV table, SOC information of a previous time period that is lastly estimated may be used. In a case of the single cell model described above with reference to FIG. 3, the SOC information of the previous time period may be an estimated SOC of the battery in the previous time period. In a case of the cell switch model described above with reference to FIGS. 4 through 6, the SOC information of the previous time period may be an estimated SOC of a previous battery selected as a target battery in the previous time period.

An estimated OCV, which is an OCV corresponding to the SOC information of the previous time period, may be obtained through the characteristic curve of the OCV table shown in FIG. 8. A previously calculated voltage difference may be applied. This example pertains to a case in which a sensed voltage is less than an estimated voltage, and thus the calculated voltage difference may be applied by subtracting the calculated voltage difference from the estimated OCV. Using the characteristic curve of the OCV table, a corrected SOC corresponding to a result of applying the calculated voltage difference may be determined, and a difference between the estimated SOC and the corrected SOC may be determined to be ΔSOC which indicates a state variation.

Figure 9:
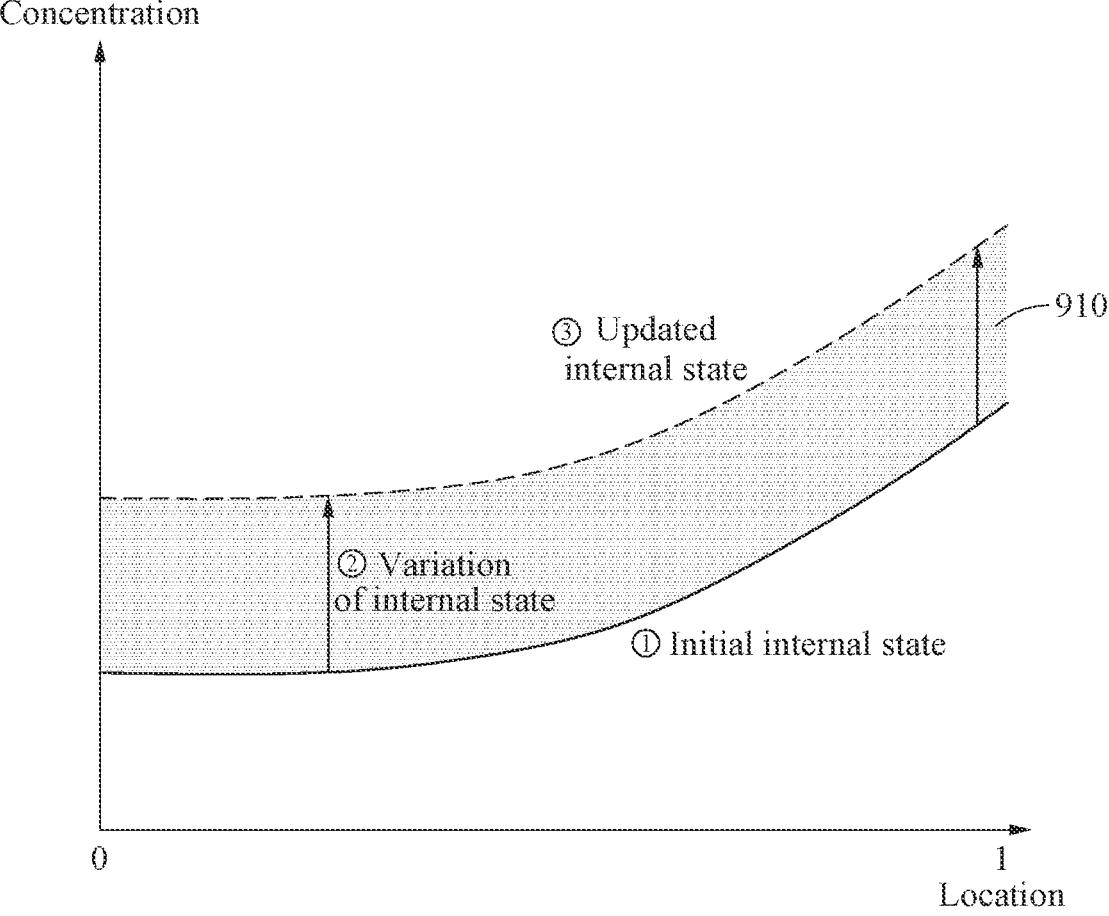
FIGS. 9, 10a, 10b, and 11 illustrate examples of updating an internal state of a battery model.
Figure 10A:
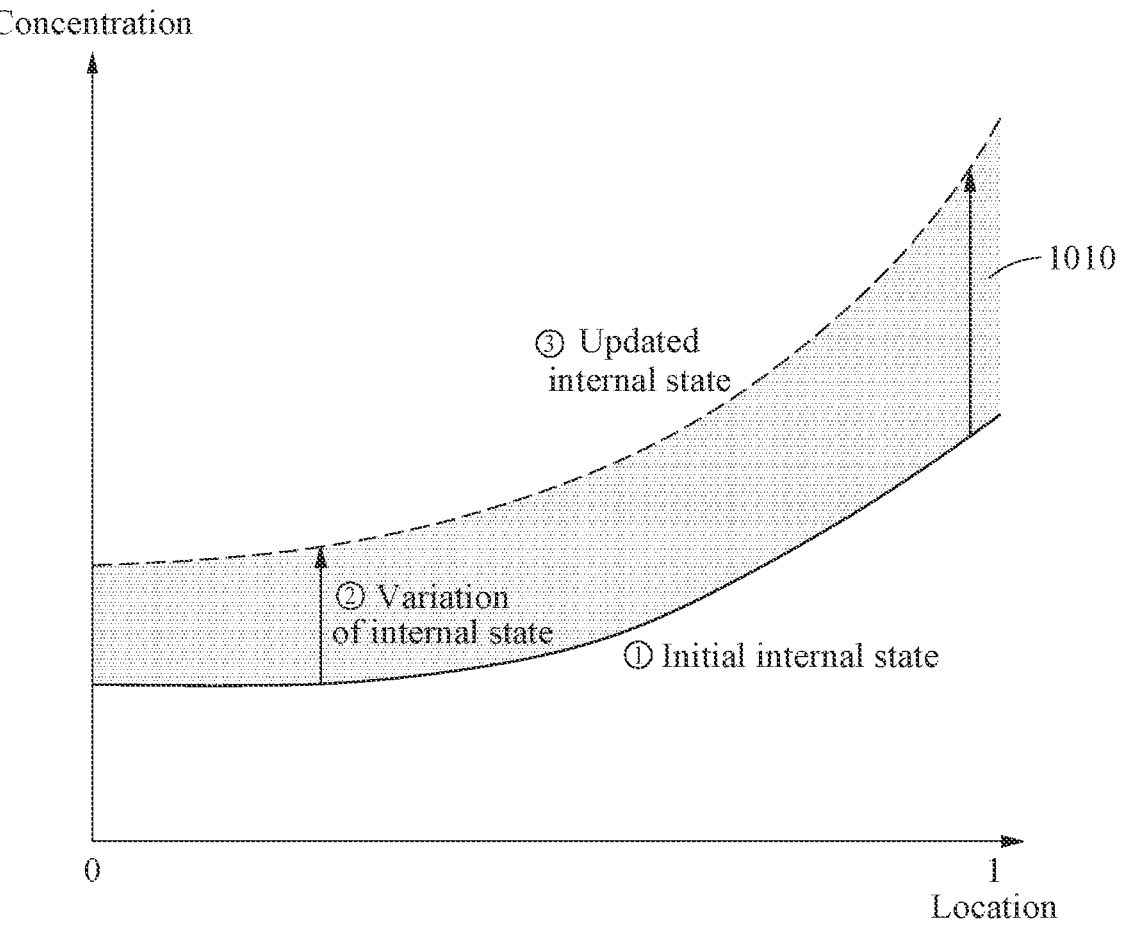
Figure 10B:
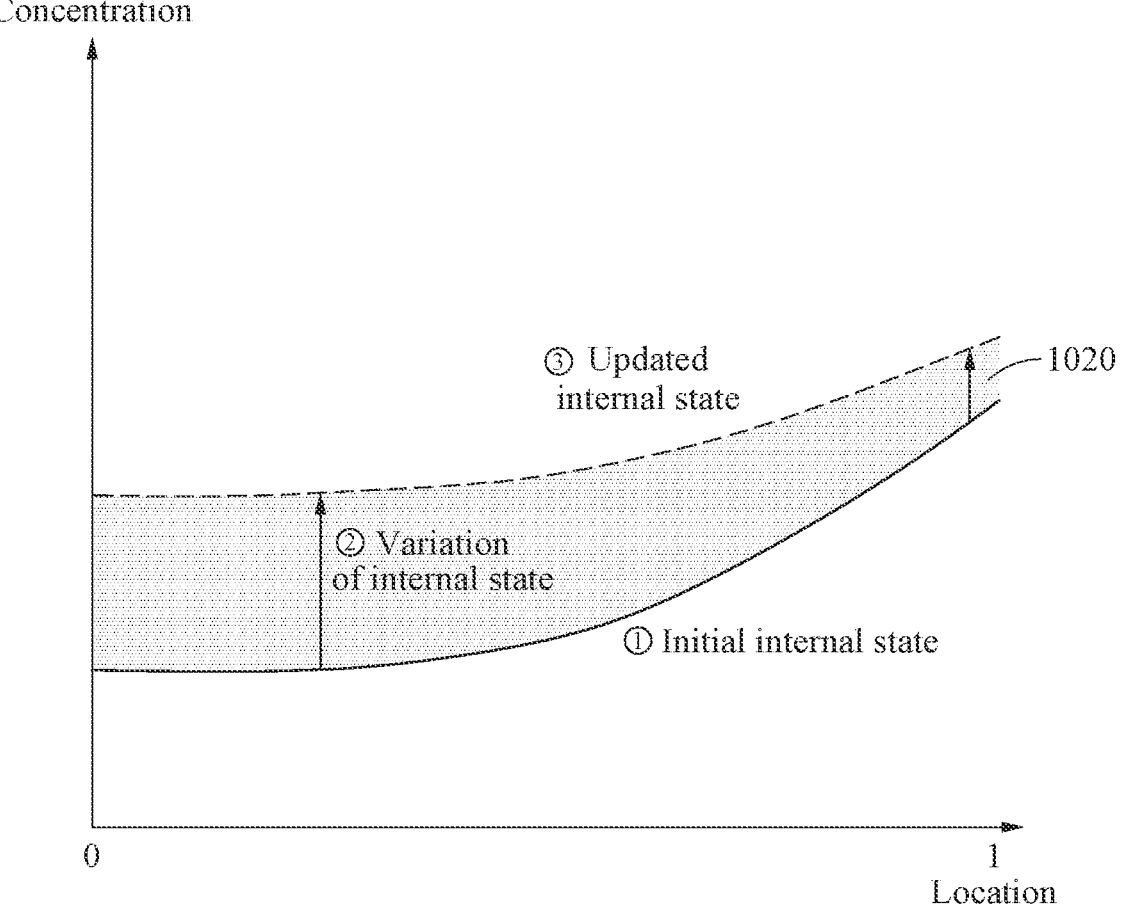
Figure 11:
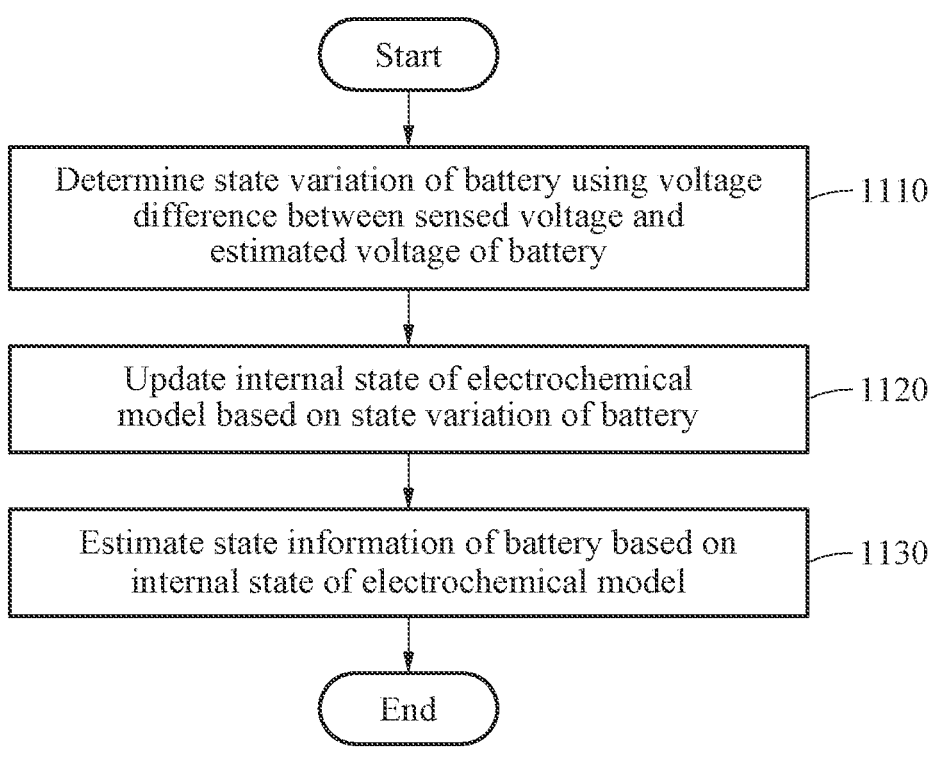

FIGS. 9 through 11 illustrate examples of updating an internal state of an electrochemical model.

In an example, a battery state estimating apparatus may update an internal state of an electrochemical model based on a state variation of a battery. The electrochemical model may be configured to model an internal physical phenomenon of the battery and estimate state information of the battery. The internal state of the electrochemical model may be provided in a form of a profile and may include, for example, a voltage, an overpotential, an SOC, a positive electrode lithium ion concentration distribution, a negative electrode lithium ion concentration distribution, and/or an electrolyte lithium ion concentration distribution. For example, the battery state estimating apparatus may update the internal state of the electrochemical model by correcting an ion concentration distribution in an active material particle or an ion concentration distribution in an electrode based on the state variation of the battery. A more detailed description of updating an internal state of an electrochemical model will follow hereinafter with reference to FIGS. 9 through 11.

FIG. 9 illustrates an example of updating an internal state of an electrochemical model by uniformly correcting an ion concentration distribution. In this example, the ion concentration distribution may indicate an ion concentration distribution in an active material particle or an ion concentration distribution in an electrode. For example, when a graph illustrated in FIG. 9 indicates the ion concentration distribution in the active material particle, a horizontal axis of the graph indicates a location in the active material particle. In this example, 0 indicates a center of the active material particle and 1 indicates a surface of the active material particle. For another example, when the graph illustrated in FIG. 9 indicates the ion concentration distribution in the electrode, a horizontal axis of the graph indicates a location in the electrode. In this example, 0 indicates one end of the electrode (e.g., a boundary adjacent to a collector) and 1 indicates another end of the electrode (e.g., a boundary adjacent to a separator).

The battery state estimating apparatus may convert a state variation of a battery to a variation of an internal state, and uniformly apply the variation to the internal state of the electrochemical model. The variation of the internal state may indicate a lithium ion concentration variation which corresponds to an area 910 between an initial internal state and an updated internal state. Such a method of uniformly updating the internal state may be applied when a current output from the battery is not large under the assumption that a concentration variation is uniform or consistent. The method may be simpler in implementation compared to a nonuniform updating method to be described hereinafter.

Alternatively, when updating the internal state in which a lithium ion concentration increases in an active material of one of a positive electrode and a negative electrode, the internal state may be updated such that a lithium ion concentration in an active material of the other one of the positive electrode and the negative electrode decreases by an increment of the increase in the lithium ion concentration in the active material in the one electrode.

FIGS. 10*a* and 10*b* illustrate an example of updating an internal state of an electrochemical model by nonuniformly correcting an ion concentration distribution. In this example, the ion concentration distribution may indicate an ion concentration distribution in an active material particle or an ion concentration distribution in an electrode. For example, when graphs illustrated in FIGS. 10*a* and 10*b* indicate the ion concentration distribution in the active material particle, a horizontal axis of the graphs indicates a location in the active material particle. In this example, 0 indicates a center of the active material particle, and 1 indicates a surface of the active material particle. For another example, when the graphs illustrated in FIGS. 10*a* and 10*b* indicate the ion concentration distribution in the electrode, the horizontal axis of the graphs indicates a location in the electrode. In this example, 0 indicates one end of the electrode (e.g., a boundary adjacent to a collector) and 1 indicates another end of the electrode (e.g., a boundary adjacent to a separator).

For example, when a conductance is substantially lowered, a current of a battery is relatively great, and/or a temperature of the battery is relatively low, an internal diffusion characteristic may be weakened based on a chemical characteristic of the battery, and, accordingly, a gradient of the ion concentration distribution may increase in an electrode direction. In this example, based on the internal diffusion characteristic of the battery, the internal state of the electrochemical model may be nonuniformly updated at each location in the active material particle or each location in the electrode.

A lithium ion may move in the battery based on the diffusion characteristic. For example, when a lithium ion of the positive electrode moves to the negative electrode, a lithium ion that is located nearest to the negative electrode among lithium ions of the positive electrode may move first. In this example, when the internal diffusion characteristic of the battery is worse than before, lithium ions may move considerably slowly in the positive electrode and a spot of the lithium ion moved out to the negative electrode may not be rapidly filled, and thus only a lithium ion located at an end of the positive electrode may continuously move out to the negative electrode and a gradient of the ion concentration distribution may increase as illustrated in the graph of FIG. 10*a*. In contrast, when the internal diffusion characteristic of the battery is better than before, a lithium ion located in the positive electrode may rapidly move to an end to fill the spot of the lithium ion moved out to the negative electrode, and thus the gradient of the ion concentration distribution may decrease as illustrated in the graph of FIG. 10*b*. As described above with reference to FIG. 9, an area between an initial internal state and an updated internal state, for example, an area 1010 of FIG. 10*a* and an area 1020 of FIG. 10*b*, may correspond to a lithium ion concentration variation. Such diffusion characteristic as described above may be based on state information (e.g., SOC) of a battery, and thus a diffusion characteristic based on a state variation of the battery may be considered. A more detailed description of consideration of a diffusion characteristic based on a state variation of the battery will follow.

The battery state estimating apparatus may determine a concentration gradient characteristic based on the diffusion characteristic based on the state variation of the battery, and update the internal state of the electrochemical model based on the determined concentration gradient characteristic. A diffusion coefficient may be derived based on an analysis of a diffusion characteristic of a state direction in which a lithium ion is to move, for example, a direction in which a lithium ion concentration increases. For example, a diffusion coefficient based on a previous SOC and a diffusion coefficient of an SOC to move may be derived. In addition, the internal state of the electrochemical model may be updated based on a concentration gradient characteristic set in advance based on the diffusion coefficient. For example, when the diffusion coefficient decreases in a direction for the movement, the internal state of the electrochemical model may be updated in a direction in which the concentration gradient increases. In contrast, when the diffusion coefficient increases in the direction for the movement, the internal state of the electrochemical model may be updated in a direction in which the concentration gradient decreases.

In another example, the electrochemical model may be a model based on a principle that a total amount of lithium ions is constantly conserved, although the lithium ions may move among the positive electrode, the negative electrode, and an electrolyte. Such movement of the lithium ions among the positive electrode, the negative electrode, and the electrolyte may be obtained based on a diffusion equation, which will be described in greater detail hereinafter.

The battery state estimating apparatus may calculate a diffusion equation of an active material based on the state variation of the battery, and update the internal state of the electrochemical model. The battery state estimating apparatus may assign a current boundary condition in a state direction to which a lithium ion is to move, for example, a direction in which a lithium ion concentration increases, to calculate the diffusion equation, and update the internal state of the electrochemical model. The battery state estimating apparatus may calculate the diffusion equation of the active material with respect to a variation of the internal state corresponding to the state variation of the battery, and update the internal state of the electrochemical model with an ion concentration distribution that is calculated through the diffusion equation. The diffusion characteristic is one physical characteristic among a plurality of physical characteristics, and thus the battery state estimating apparatus may nonuniformly update the internal state of the electrochemical model by calculating the diffusion equation with respect to the ion concentration distribution.

FIG. 11 is a flowchart illustrating an example of a method of estimating a state of a battery. The example method of estimating a state of a battery will be hereinafter simply referred to as a battery state estimating method.

The battery state estimating method to be described hereinafter with reference to FIG. 11 may 11 may be performed, for example, by a processor included in a battery state estimating apparatus.

Referring to FIG. 11, in operation 1110, the battery state estimating apparatus determines a state variation of a battery using a voltage difference between a sensed voltage of the battery and an estimated voltage of the battery that is estimated by an electrochemical model. The battery state estimating apparatus may determine the state variation of the battery based on the voltage difference, previous state information that is previously estimated by the electrochemical model, and an OCV table. For example, the battery state estimating apparatus may determine the state variation of the battery by obtaining an OCV corresponding to the previous state information based on the OCV table, and applying the voltage difference to the obtained OCV.

In operation 1120, the battery state estimating apparatus updates an internal state of the electrochemical model based on the state variation of the battery. The battery state estimating apparatus may update the internal state of the electrochemical model by correcting an ion concentration distribution in an active material particle or an ion concentration distribution in an electrode based on the state variation of the battery. For example, the battery state estimating apparatus may update the internal state of the electrochemical model by uniformly correcting the ion concentration distribution in the active material particle or the ion concentration distribution in the electrode to be consistent based on the state variation of the battery. In addition, the battery state estimating apparatus may update the internal state of the electrochemical model by determining a concentration gradient characteristic based on a diffusion characteristic based on the state variation of the battery, and correcting the ion concentration distribution in the active material particle or the ion concentration distribution in the electrode based on the determined concentration gradient characteristic. In addition, the battery state estimating apparatus may update the internal state of the electrochemical model by calculating a diffusion equation of an active material based on the state variation of the battery, and correcting the ion concentration distribution in the active material particle or the ion concentration distribution in the electrode.

In operation 1130, the battery state estimating apparatus estimates state information of the battery based on the internal state of the electrochemical model.

According to an example, before performing operation 1110, the battery state estimating apparatus may verify whether the voltage difference between the sensed voltage of the battery and the estimated voltage of the battery exceeds a threshold voltage difference. When the voltage difference exceeds the threshold voltage difference, the battery state estimating apparatus may perform operations 1110 through 1130.

For a more detailed description of examples of the battery state estimation method, reference may be made to the descriptions provided above with reference to FIGS. 1 through 10.

Figure 12A:
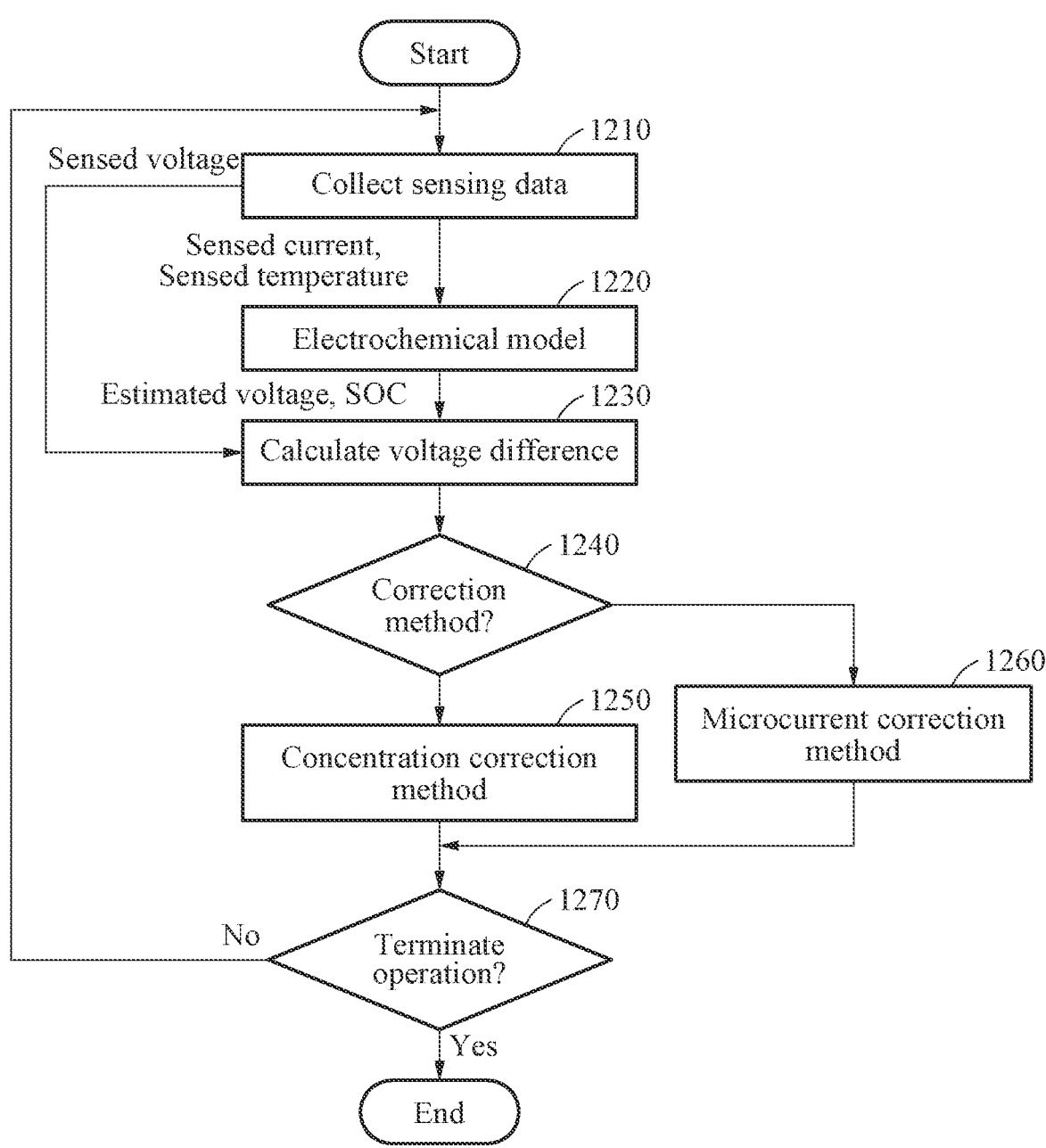
FIGS. 12a and 12b illustrate another example of a method of estimating a state of a battery.
Figure 12B:
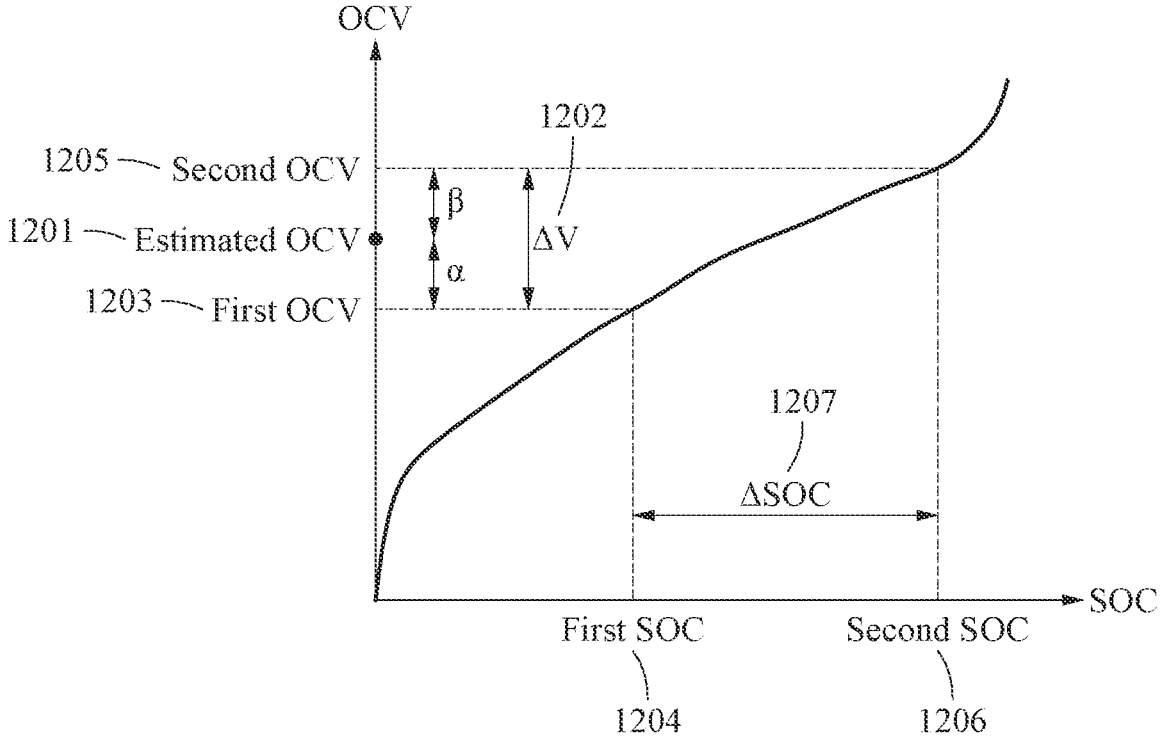

FIGS. 12*a* and 12*b* illustrate another example of a battery state estimating method.

FIG. 12*a* is a flowchart illustrating another example of a battery state estimating method to be performed by a processor included in a battery state estimating apparatus. A state of a battery may be estimated in a plurality of time periods. In the example of FIG. 12*a*, state information of the battery may be estimated in each of the time periods.

Referring to FIG. 12*a*, in operation 1210, the battery state estimating apparatus collects sensing data of a battery. The sensing data may include, for example, a sensed voltage, a sensed current, and a sensed temperature of the battery.

In operation 1220, an estimated voltage of the battery and state information, for example, an SOC, of the battery is determined by an electrochemical model to which a sensed current and a sensed temperature are input.

In operation 1230, the battery state estimating apparatus calculates a first voltage difference between a voltage of the battery sensed in a current time period and a voltage of the battery estimated by the electrochemical model in the current time period. For example, the first voltage difference may be determined to be a moving average voltage for a latest preset time period.

Although not illustrated in FIG. 12*a*, according to an example, the battery state estimating apparatus may determine whether state information of the battery needs to be corrected based on whether the calculated first voltage difference exceeds a first threshold voltage difference. When an error occurs in the electrochemical model, the estimated voltage, which is a voltage estimated using the electrochemical model, may differ from the sensed voltage of the battery. Thus, to prevent errors from being accumulated, the battery state estimating apparatus may determine whether the correcting is needed based on the calculated first voltage difference.

For example, when the calculated first voltage difference exceeds the first threshold voltage difference, the battery state estimating apparatus determines that the state information of the battery needs to be corrected and performs operation 1240. In contrast, for example, when the calculated first voltage difference does not exceed the first threshold voltage difference, the battery state estimating apparatus determines that the state information of the battery does not need to be corrected and returns to operation 1210 in a next time period.

In operation 1240, the battery state estimating apparatus selects at least one correction method from an ion concentration correction method and a microcurrent correction method. For example, when the calculated first voltage difference exceeds a preset second threshold voltage difference, the battery state estimating apparatus may select the ion concentration correction method, and, otherwise, may select the microcurrent correction method. Alternatively, the battery state estimating apparatus may select at least one correction method from among the ion concentration correction method and the microcurrent correction method such that the ion concentration correction method is performed for each first period and the microcurrent correction method is performed for each second period. In such an example, the first period may be longer than the second period. That is, the microcurrent correction method may be more frequently performed than the ion concentration correction method.

In operation 1250, when the ion concentration correction method is selected, the battery state estimating apparatus corrects an internal state of the electrochemical model using a state variation of the battery that is determined by the calculated first voltage difference. For a more detailed description of an example of the ion concentration correction method, reference may be made to the descriptions provided above with reference to FIGS. 1 through 11.

In operation 1260, when the microcurrent correction method is selected, the battery state estimating apparatus corrects a sensed current of the battery in the current time period that is to be input to the electrochemical model, using a capacity error corresponding to a second voltage difference between a sensed voltage of the battery in a previous time period and an estimated voltage in the previous time period. The microcurrent correction method will be described in detail hereinafter.

The battery state estimating apparatus may receive the sensed current of the battery in the current time period, and may determine a correction value using a capacity error corresponding to a voltage difference of the battery in the previous time period. The battery state estimating apparatus may then correct the sensed current using the correction value. The corrected sensed current may then be input to the electrochemical model.

The voltage difference in the previous time period may be a difference between the estimated voltage of the battery in the previous time period and the sensed voltage of the battery in the previous time period.

The capacity error may be determined based on the voltage difference in the previous time period and an estimated OCV in the previous time period. An example of a manner by which the capacity error may be determined will be described hereinafter by referring to an OCV table illustrated in FIG. 12b, for convenience of description.

Referring to FIG. 12b, a first SOC 1204 is determined. The first SOC 1204 corresponds to a first OCV 1203 obtained by subtracting a value $\alpha$ of a portion of a voltage difference $\Delta V$ 1202 from an estimated OCV 1201, which is an estimated OCV in a previous time period. In addition, a second SOC 1206 is determined. The second SOC 1206 corresponds to a second OCV 1205 obtained by adding a value $\beta$ of a remaining portion of the voltage difference $\Delta V$ 1202 to the estimated OCV 1201. A state difference $\Delta SOC$ 1207 between the first SOC 1204 and the second SOC 1206 is multiplied by a capacity of the battery, and then the capacity error may be determined.

The correction value may be determined as a value obtained by applying a weight to the capacity error and dividing, by a constant value, the capacity error to which the weight is applied. The weight may be determined based on an average current value to be calculated based on a sensed current in a current time period and/or a sensed current in a previous time period. For example, when the average current value is relatively great, the weight may be determined to be relatively small. In contrast, when the average current value is relatively small, the weight may be determined to be relatively great. The constant value may indicate a state information updating period, for example, a length of a certain period.

An example of the microcurrent correction method is described in greater detail in U.S. Patent Application Publication No. 2018-0143254, the entire disclosure of which is incorporated herein by reference.

In operation 1270, the battery state estimating apparatus determines whether to terminate an operation of estimating a state of the battery. For example, when a preset operation period has not elapsed, operation 1210 may be performed in a next time period. In contrast, when the preset operation period has elapsed, the operation of estimating a state of the battery may be terminated.

Figure 13:
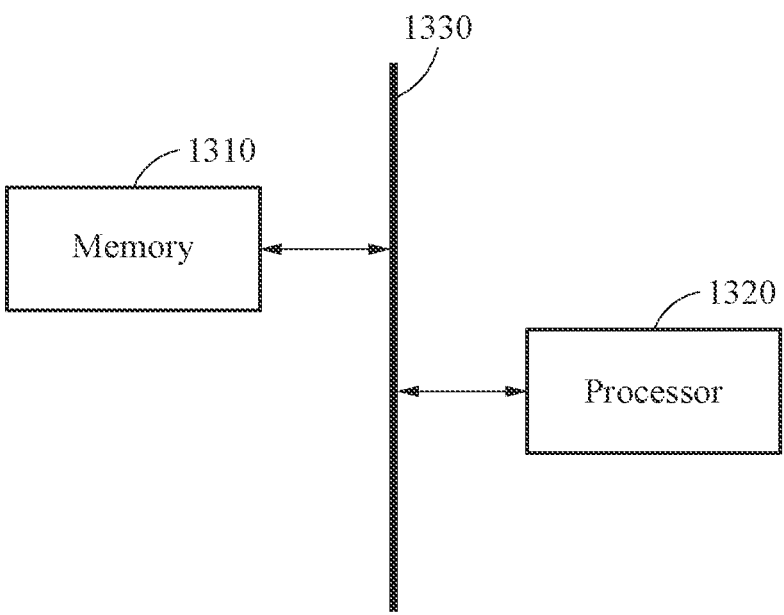
FIG. 13 illustrates an example of an apparatus with battery state estimation.

FIG. 13 illustrates an example of a battery state estimating apparatus.

Referring to FIG. 13, a battery state estimating apparatus 1300 may include, for example, a memory 1310 and a processor 1320. The memory 1310 and the processor 1320 may communicate with each other through a bus 1330.

The memory 1310 may include computer-readable instructions. When an instruction stored in the memory 1310 is executed by the processor 1320, the processor 1320 may perform one or more, or all, of operations or methods described above. The memory 1310 may be a volatile or nonvolatile memory.

The processor 1320 may execute instructions or programs, or control the battery state estimating apparatus 1300. The processor 1320 may determine a state variation of a battery using a voltage difference between a sensed voltage of the battery and an estimated voltage of the battery that is estimated by an electrochemical model, update an internal state of the electrochemical model based on the determined state variation, and estimate state information of the battery based on the updated internal state of the electrochemical model.

In addition, the battery state estimating apparatus 1300 may perform the operations or methods described above.

Figure 14:
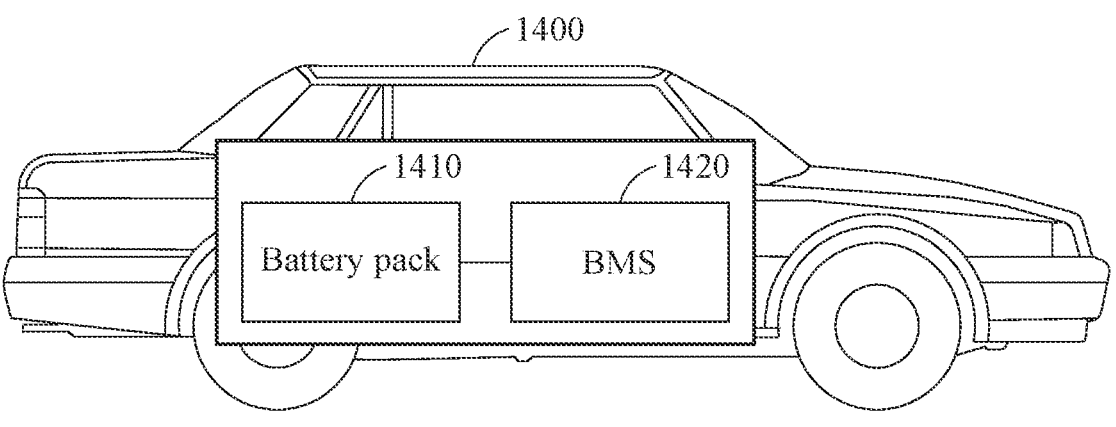
FIGS. 14 and 15 illustrate an example of a vehicle embodiment.
Figure 15:
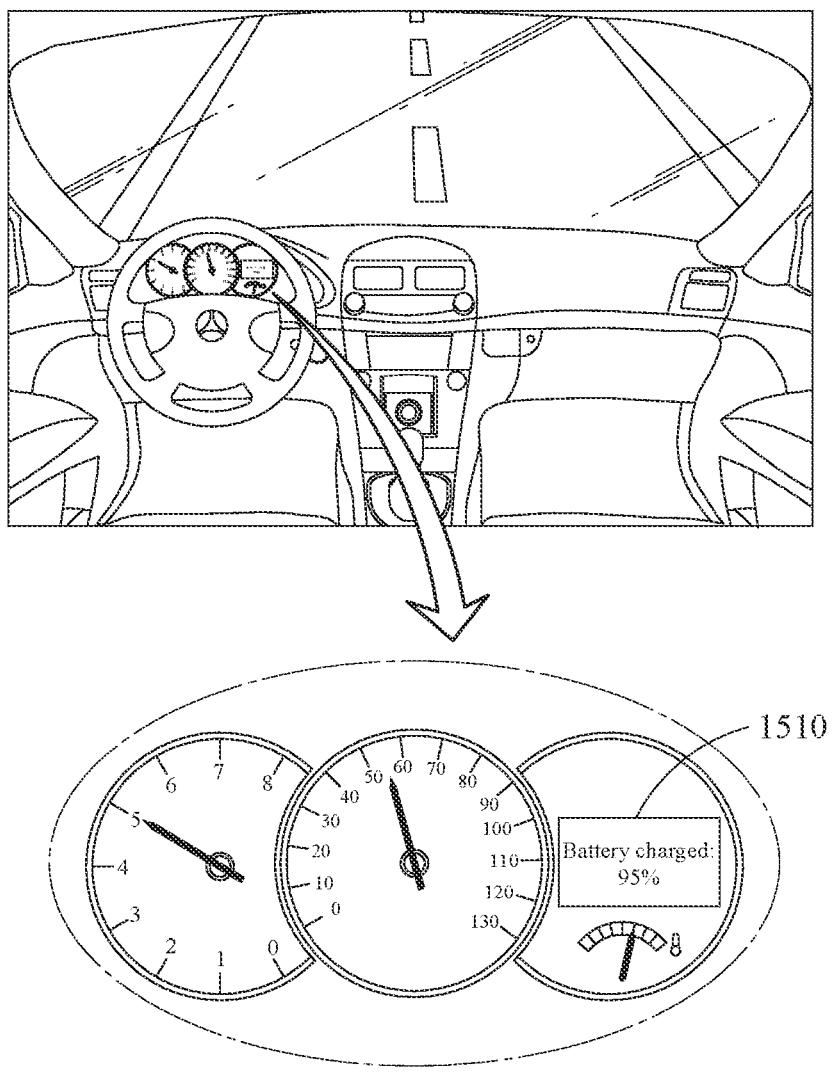

FIGS. 14 and 15 illustrate an example of a vehicle.

Referring to FIG. 14, a vehicle 1400 may include, for example, a battery pack 1410 and a battery management system (BMS) 1420. The vehicle 1400 may use the battery pack 1410 as a power source. The vehicle 1400 may be an electric vehicle or a hybrid vehicle, for example.

The battery pack 1410 may include a plurality of battery modules each including a plurality of battery cells.

The BMS 1420 may monitor whether an abnormality occurs in the battery pack 1410, and prevent the battery pack 1410 from being over-charged or over-discharged. In addition, when a temperature of the battery pack 1410 exceeds a first temperature, for example, 40° C. or is less than a second temperature, for example, −10° C., the BMS 1420 may perform thermal control on the battery pack 1410. In addition, the BMS 1420 may perform cell balancing to equalize charging states of the battery cells included in the battery pack 1410.

In an example, the BMS 1420 may include a battery state estimating apparatus described above, and determine state information of each of the battery cells included in the battery pack 1410 or state information of the battery pack 1410. The BMS 1420 may determine, to be the state information of the battery pack 1410, a maximum value, a minimum value, or an average value of the state information the battery cells.

The BMS 1420 may transmit the state information of the battery pack 1410 to an electronic control unit (ECU) or a vehicle control unit (VCU) of the vehicle 1400. The ECU or the VCU of the vehicle 1400 may output the state information of the battery pack 1410 to a display of the vehicle 1400.

As illustrated in FIG. 15, the ECU or the VCU may display the state information of the battery pack 1410 on a dashboard 1510. Alternatively, the ECU or the VCU may display, on the dashboard 1510, a remaining available travel distance determined based on the estimated state information. Alternatively or additionally, the ECU or the VCU may display the state information, the remaining available travel distance, and the like on a head-up display of the vehicle 1400.

For a more detailed description of example features and operations of the vehicle 1400, reference may be made to the descriptions provided above with reference to FIGS. 1 through 13, and a more detailed and repeated description will be omitted here for brevity.

Figure 16:
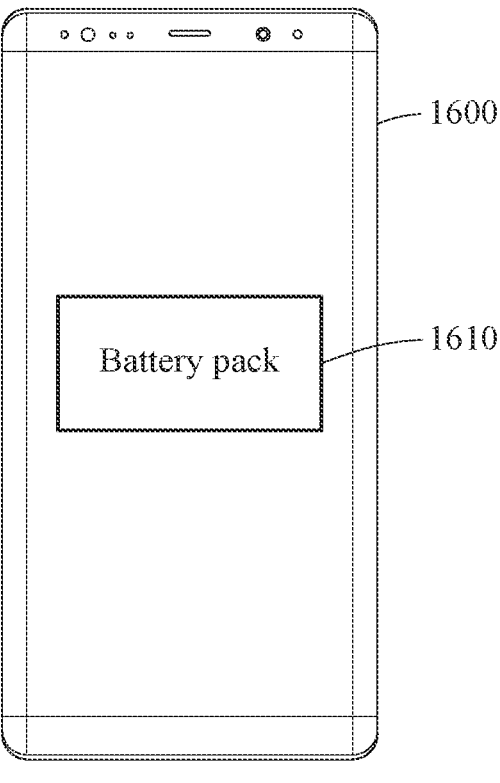
FIG. 16 illustrates an example of a mobile device embodiment.

FIG. 16 illustrates an example of a mobile device.

Referring to FIG. 16, a mobile device 1600 includes a battery pack 1610. The mobile device 1600 may use the battery pack 1610 as a power source. The mobile device 1600 may be a portable terminal such as a smartphone. FIG. 16 illustrates the mobile device 1600 as a smartphone as an example for the convenience of description. However, the mobile device 1600 may be other terminals, for example, a laptop computer, a tablet personal computer (PC), a wearable device, and the like. The battery pack 1610 may include a BMS and battery cells (or battery modules).

In an example, the mobile device 1600 may include a battery state estimating apparatus described above. The battery state estimating apparatus may update an internal state of an electrochemical model based on a state variation of the battery pack 1610 or the battery cells included in the battery pack 1610, and may estimate state information of the battery pack 1610 based on the updated internal state of the electrochemical model.

For a more detailed description of example features and operations of the mobile device 1600, reference may be made to the descriptions provided above with reference to FIGS. 1 through 15 and a more detailed and repeated description will be omitted here for brevity.

The battery apparatuses, the battery apparatus 100, the battery state estimating apparatuses, the battery state estimating apparatuses 120 and 1300, the memories, the memory 1310, the processors, the processor 1320, the bus 1330, the BMSs, the BMS 1420, the ECU, and the VCU in FIGS. 1-16 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-16 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus with battery state estimation, comprising:
a processor configured to:
obtain a sensed voltage of a battery from a voltage sensor;
estimate, using an electrochemical model, an estimated voltage of the battery from the sensed voltage;
determine a first voltage difference between the sensed voltage of the battery and the estimated voltage of the battery;
in response to the first voltage difference being greater than a threshold voltage difference, determine a correction method of correcting an internal state of the electrochemical model;
in response to the first voltage difference being less than or equal to the threshold voltage difference, determine a correction method of correcting a sensed current to be input to the electrochemical model, to apply the determined correction method to the electrochemical model;
estimate state information of the battery using the electrochemical model to which the determined correction method is applied; and
perform at least one of operations including monitoring abnormalities, preventing over-charge, preventing over-discharge, performing thermal control, or performing cell balancing based on a result of the estimating state information of the battery.

2. The apparatus of claim 1, wherein the processor is further configured to
update the internal state of the electrochemical model using a state variation of the battery determined by the first voltage difference between a voltage of the battery sensed in a current time period and a voltage of the battery estimated by the electrochemical model; or
correct a sensed current of the battery in the current time period to be input to the electrochemical model using a capacity error corresponding to a second voltage difference between a sensed voltage of the battery in a previous time period and an estimated voltage of the battery in the previous time period.

3. The apparatus of claim 1, wherein the processor is further configured to determine a correction method of the electrochemical model such that the correction method of correcting the sensed current to be input to the electrochemical model is to be performed more frequently than the correction method of correcting the internal state of the electrochemical model.

4. An apparatus with battery state estimation, comprising:
a processor configured to:
obtain a sensed voltage of a battery from a voltage sensor;
estimate, using an electrochemical model, an estimated voltage of the battery from the sensed voltage;
determine a first voltage difference between the sensed voltage of the battery and the estimated voltage of the battery;
determine one of a plurality of correction methods of the electrochemical model based on a result of comparing the first voltage difference to a threshold voltage difference;
depending on the determined correction method, correct an internal state of the electrochemical model or correcting a sensed current to be input to the electrochemical model, by applying the determined correction method to the electrochemical model;
estimate state information of the battery using the electrochemical model to which the determined correction method is applied; and
perform at least one of operations including monitoring abnormalities, preventing over-charge, preventing over-discharge, performing thermal control, or performing cell balancing based on a result of the estimating state information of the battery,
wherein the processor is further configured to determine the correction method of the electrochemical model such that a correction method of correcting the sensed current to be input to the electrochemical model is to be performed more frequently than a correction method of correcting the internal state of the electrochemical model.

5. The apparatus of claim 4, wherein the determining of the correction method of the electrochemical model based on the first voltage difference comprises:
in response to the first voltage difference being greater than the threshold voltage difference, selecting the correction method of correcting the internal state of the electrochemical model; and
in response to the first voltage difference being less than or equal to the threshold voltage difference, selecting the correction method of correcting the sensed current to be input to the electrochemical model.

* * * * *